US012607665B2

(12) United States Patent
Sung et al.

(10) Patent No.: US 12,607,665 B2
(45) Date of Patent: Apr. 21, 2026

(54) ELECTRONIC DEVICES RELATED TO MONITORING OF INTERNAL NODES

(71) Applicant: SK hynix Inc., Icheon-si Gyeonggi-do (KR)

(72) Inventors: Ki Hyuk Sung, Icheon-si Gyeonggi-do (KR); Seung Ho Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 233 days.

(21) Appl. No.: 18/499,013

(22) Filed: Oct. 31, 2023

(65) Prior Publication Data

US 2025/0044342 A1 Feb. 6, 2025

(30) Foreign Application Priority Data

Aug. 1, 2023 (KR) ........................ 10-2023-0100673

(51) Int. Cl.
*G01R 31/26* (2020.01)
(52) U.S. Cl.
CPC ................................ *G01R 31/2621* (2013.01)

(58) Field of Classification Search
CPC .. G01R 31/2621; G01R 31/26; G01R 31/317; G01R 31/31724; G01R 31/28; G01R 31/2884; G01R 31/31713; G01R 31/31718; G01R 31/327; G01R 31/3275; G01R 31/319; G01R 31/31924
See application file for complete search history.

(56) References Cited

U.S. PATENT DOCUMENTS

| | | | |
|---|---|---|---|
| 9,267,992 B2 | 2/2016 | Shiraishi et al. | |
| 2020/0313428 A1 | 10/2020 | Delshadpour et al. | |
| 2020/0371157 A1* | 11/2020 | Choi .............. | G01R 31/318511 |
| 2024/0310427 A1* | 9/2024 | Matsumoto ........ | G01R 31/2644 |

* cited by examiner

*Primary Examiner* — Son T Le
(74) *Attorney, Agent, or Firm* — WILLIAM PARK AND ASSOCIATES LTD.

(57) ABSTRACT

An electronic device includes a power detection signal generation circuit configured to receive power to generate a power detection signal, a switch control signal generation circuit configured to generate a switch control signal when a test for monitoring internal nodes is performed, and a monitoring control circuit configured to connect one of the internal nodes to a test node, based on the power detection signal and the switch control signal, and to output a monitoring signal through the test node.

18 Claims, 9 Drawing Sheets

<u>2</u>

ELECTRONIC DEVICES RELATED TO MONITORING OF INTERNAL NODES

CROSS-REFERENCE TO RELATED APPLICATIONS

The present application claims priority under 35 U.S.C. 119(a) to Korean Patent Application No. 10-2023-0100673, filed on Aug. 1, 2023, in the Korean Intellectual Property Office, which is incorporated herein by reference in its entirety.

BACKGROUND

1. Technical Field

Embodiments of the present disclosure generally relate to electronic devices, and more particularly, to electronic devices related to monitoring of internal nodes.

2. Related Art

In general, an electronic device includes a plurality of internal circuits connected to internal nodes to perform various internal operations. In order to check whether the internal circuits included in an electronic device operate correctly, a test performed by checking a voltage or current of the internal node through a test pin is used.

SUMMARY

An embodiment of the present disclosure may provide an electronic device including a power detection signal generation circuit configured to receive power to generate a power detection signal, a switch control signal generation circuit configured to generate a switch control signal when a test for monitoring internal nodes is performed, and a monitoring control circuit configured to connect one of the internal nodes to a test node, based on the power detection signal and the switch control signal, and to output a monitoring signal through the test node.

In addition, an embodiment of the present disclosure may provide an electronic system including a test circuit configured to supply power and to receive a monitoring signal, and an electronic device configured to receive the power to generate a power detection signal, to generate a switch control signal when a test for monitoring internal nodes is performed, to connect one of the internal nodes to a test node, based on the power detection signal and the switch control signal, and to output the monitoring signal through the test node.

In addition, an embodiment of the present disclosure may provide an electronic system including a test circuit configured to supply power, to supply a switch control signal generated when a test for monitoring internal nodes is performed, and to receive a monitoring signal, and an electronic device configured to receive the power to generate a power detection signal, to connect one of the internal nodes to a test node, based on the power detection signal and the switch control signal, and to output the monitoring signal through the test node.

DETAILED DESCRIPTION

In the following description, when a parameter is referred to as being "predetermined" or "preset" it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
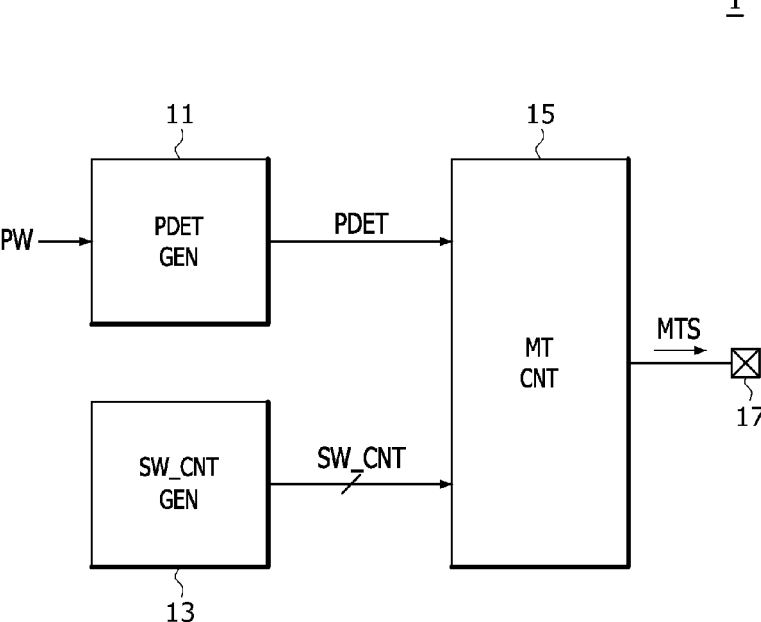
FIG. 1 is a block diagram illustrating a configuration of an electronic device according to an embodiment of the present disclosure.

FIG. 1 is a block diagram illustrating a configuration of an electronic device 1 according to an embodiment of the present disclosure. As shown in FIG. 1, the electronic device 1 may include a power detection signal generation circuit (PDET GEN) 11, a switch control signal generation circuit (SW_CNT GEN) 13, and a monitoring control circuit (MT CNT) 15.

The power detection signal generation circuit 11 may receive power PW to generate a power detection signal PDET. The power PW may be supplied from the outside of the electronic device 1. For example, the electronic device 1 may perform a test for monitoring internal nodes (nd11_1, nd11_2~nd11_L in FIG. 3) after receiving the power PW that rises to a preset voltage level from 0 V. The power detection signal generation circuit 11 may generate the power detection signal PDET that is activated when the power PW increased to the preset voltage level is detected. The preset voltage level of the power PW may be variously set according to embodiments. The power detection signal generation circuit 11 may be connected to the monitoring control circuit 15, and may provide the power detection signal PDET to the monitoring control circuit 15. As used herein, the tilde "~" indicates a range of components. For example, "nd11_2~nd11_L" indicates the internal nodes nd11_2, nd11_3, . . . , and nd11_L shown in FIG. 3.

The switch control signal generation circuit 13 may generate a switch control signal SW_CNT when a test for monitoring the internal nodes (nd11_1, nd11_2~nd11_L in FIG. 3) is performed. The switch control signal SW_CNT may include a plurality of bits, and the plurality of bits included in the switch control signal SW_CNT may respectively correspond to the internal nodes (nd11_1, nd11_2~nd11_L in FIG. 3). The number of bits included in the switch control signal SW_CNT may be set equal to the number L of the internal nodes (nd11_1, nd11_2~nd11_L in FIG. 3), but this is only an embodiment and is not limited thereto. The switch control signal generation circuit 13 may be connected to the monitoring control circuit 15, and may provide the switch control signal SW_CNT to the monitoring control circuit 15.

The monitoring control circuit 15 may perform a test for monitoring the internal nodes (nd11_1, nd11_2~nd11_L in FIG. 3) to generate a monitoring signal MTS, based on the power detection signal PDET and the switch control signal SW_CNT. The monitoring control circuit 15 may output the monitoring signal MTS through a test pin 17. The monitoring control circuit 15 may perform the test for monitoring the internal nodes (nd11_1, nd11_2~nd11_L in FIG. 3) to generate the monitoring signal MTS after the power detection signal PDET is activated. The monitoring control circuit 15 may perform the test for monitoring one of the internal nodes (nd11_1, nd11_2~nd11_L in FIG. 3) according to a logic bit set of the bits included in the switch control signal SW_CNT to generate the monitoring signal MTS. For example, the monitoring control circuit 15 may perform a test for monitoring the internal node (171_1 in FIG. 3) to generate the monitoring signal MTS when the bits included in the switch control signal SW_CNT has a first logic bit set. For another example, the monitoring control circuit 15 may perform a test for monitoring the internal node (171_2 in FIG. 3) to generate the monitoring signal MTS when the bits included in the switch control signal SW_CNT has a second logic bit set.

Figure 2:
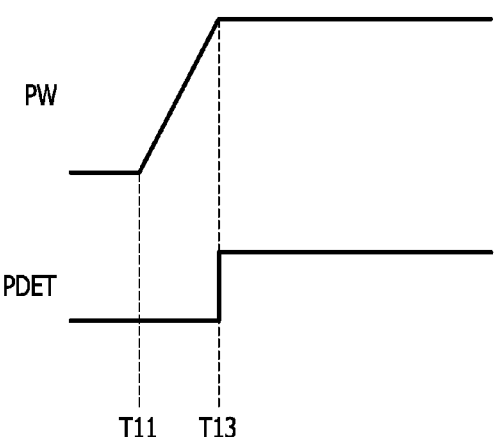
FIG. 2 is a timing diagram illustrating an operation of a power detection signal generation circuit included in the electronic device shown in FIG. 1.

FIG. 2 is a timing diagram illustrating an operation of the power detection signal generation circuit 11 included in the electronic device 1 of FIG. 1. As shown in FIG. 2, at a time point T11, when a test for monitoring the internal nodes (nd11_1, nd11_2~nd11_L in FIG. 3) is performed, the power detection signal generation circuit 11 may receive the power PW that rises from 0 V to a preset voltage level. At a time point T13, when the power PW rises to the preset voltage level, the power detection signal generation circuit 11 may generate the power detection signal PDET that is activated at a logic "high" level.

Figure 3:
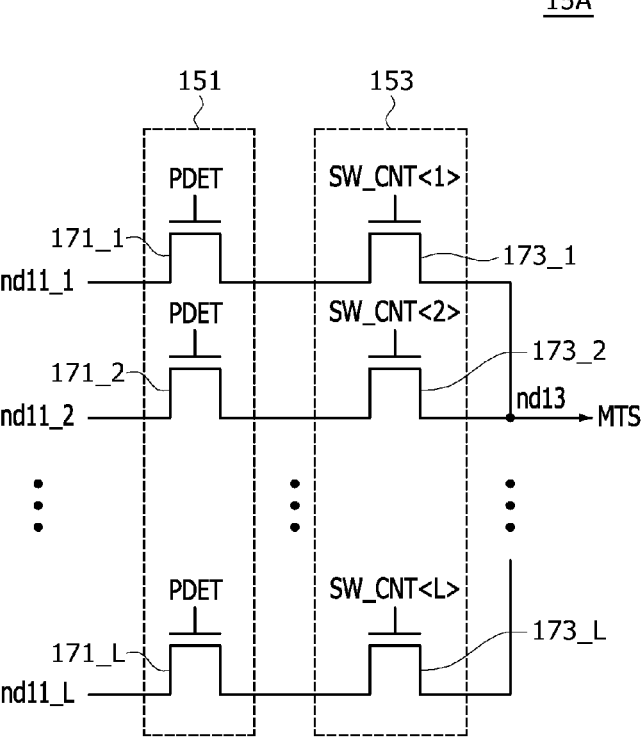
FIG. 3 is a circuit diagram according to an example of a monitoring control circuit included in the electronic device shown in FIG. 1.

FIG. 3 is a circuit diagram of a monitoring control circuit 15A according to an example of the monitoring control circuit 15 included in the electronic device 1 of FIG. 1. As shown in FIG. 3, the monitoring control circuit 15A may include a connection control circuit 151 and a switch control circuit 153.

The connection control circuit 151 may connect the internal nodes nd11_1 and nd11_2~nd11_L to the switch control circuit 153 when the power PW rises to a preset voltage level and the power detection signal PDET activated at a logic "high" level is generated. The connection control circuit 151 may include NMOS transistors 171_1 and 171_2~171_L each operating as a power switch. The NMOS transistor 171_1 may be turned on when the power PW rises to the preset voltage level and the power detection signal PDET is activated at a logic "high" level to connect the internal node nd11_1 to the switch control circuit 153. The NMOS transistor 171_2 may be turned on when the power detection signal PDET is activated at a logic "high" level to connect the internal node nd11_2 to the switch control circuit 153. The NMOS transistor 171_L may be turned on when the power detection signal PDET is activated at a logic "high" level to connect the internal node nd11_L to the switch control circuit 153.

The switch control circuit 153 may connect one of the internal nodes nd11_1, nd11_2~nd11_L to a test node nd13 according to the switch control signal SW_CNT when the test for monitoring the internal nodes nd11_1, nd11_2~nd11_L is performed. The switch control signal SW_CNT may include first to $L^{th}$ bits SW_CNT<1:L> of the switch control signal. The switch control circuit 153 may include NMOS transistors 173_1 and 173_2~173_L each operating as a selection switch. The NMOS transistor 173_1 may be turned on to connect the node nd11_1 to the test node nd13 when the first bit SW_CNT<1> of the switch control signal of a logic "high" level is received in a state where the NMOS transistor 171_1 included in the connection control circuit 151 is turned on by the power detection signal PDET activated at a logic "high" level. Because the voltage or current of the node nd11_1 is output as the monitoring signal MTS when the node nd11_1 is connected to the test node nd13, the node nd11_1 can be monitored. The NMOS transistor 173_2 may be turned on to connect the node nd11_2 to the test node nd13 when the second bit SW_CNT<2> of the switch control signal of a logic "high" level is received in a state where the NMOS transistor 171_2 included in the connection control circuit 151 is turned on by the power detection signal PDET activated at a logic "high" level. Because the voltage or current of the node nd11_2 is output as the monitoring signal MTS when the node nd11_2 is connected to the test node nd13, the node nd11_2 can be monitored. The NMOS transistor 173_L may be turned on to connect the node nd11_L to the test node nd13 when the $L^{th}$ bit SW_CNT<L> of the switch control signal of a logic "high" level is received in a state where the NMOS transistor 171_L included in the connection control circuit 151 is turned on by the power detection signal PDET activated at a logic "high" level. Because the voltage or current of the node nd11_L is output as the monitoring signal MTS when the node nd11_L is connected to the test node nd13, the node nd11_L can be monitored.

As described above, the electronic device 1 according to an embodiment may select and stably monitor one of the internal nodes nd11_1 and nd11_2~nd11_L after the power PW is raised to a preset voltage level. In an embodiment, by controlling whether to perform the test operation, based on the power PW applied to the electronic device 1, additional test pins are not used to control whether to perform the test operation and the layout area can be reduced. In addition, the electronic device 1 according to an embodiment can reduce the layout area by monitoring the internal nodes nd11_1 and nd11_2~nd11_L through one test pin nd13.

FIGS. 4 to 7 are diagrams illustrating an operation of the electronic device 1 according to an embodiment of the present disclosure.

Figure 4:
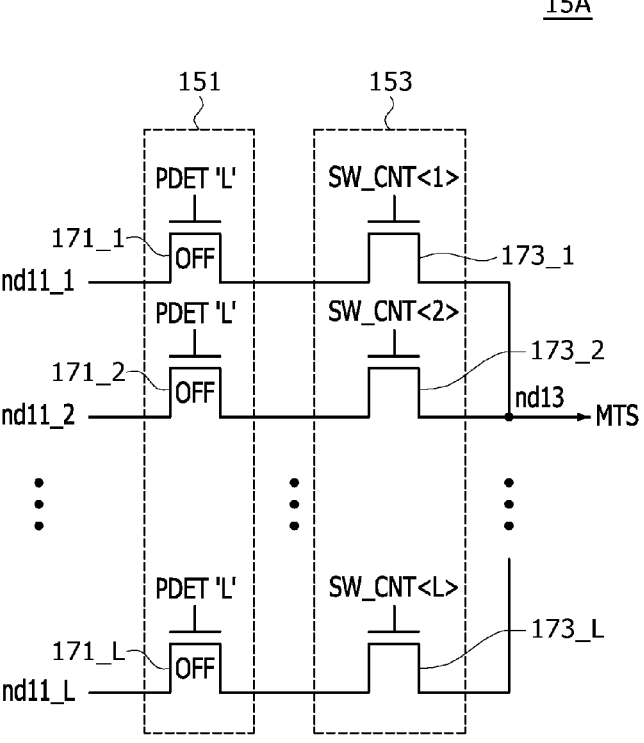
FIGS. 4 to 7 are diagrams illustrating an operation of an electronic device according to an embodiment of the present disclosure.

As shown in FIG. 4, because the power detection signal PDET is deactivated at a logic "low" level 'L' until the power PW received by the electronic device 1 rises to a preset voltage level, all of the NMOS transistors 171_1 and 171_2~171_L included in the connection control circuit 151 may be turned off 'OFF'. Accordingly, the internal nodes nd11_1 and nd11_2~nd11_L might not be connected to the switch control circuit 153.

Figure 5:
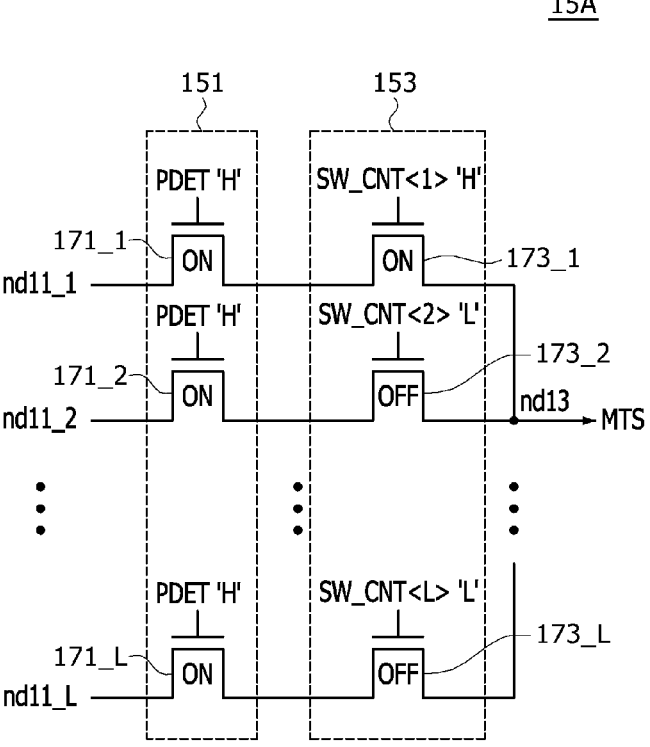

As shown in FIG. 5, when the power PW received by the electronic device 1 rises to the preset voltage level and the power detection signal PDET is activated at a logic "high" level 'H', all of the NMOS transistors 171_1 and 171_2~171_L included in the connection control circuit 151 may be turned on 'ON'. Accordingly, the internal nodes nd11_1, nd11_2~nd11_L may be connected to the switch control circuit 153. When a test for monitoring the internal nodes nd11_1, nd11_2~nd11_L is performed and the first to $L^{th}$ bits SW_CNT<1:L> of the switch control signal are set to have a first logic bit set, the NMOS transistor 173_1 included in the switch control circuit 153 may be turned on 'ON', and all of the NMOS transistors 173_2~173_L may be turned off 'OFF'. Here, the case where the first to $L^{th}$ bits SW_CNT<1:L> of the switch control signal are set to have the first logic bit set may mean a case in which the first bit SW_CNT<1> of the switch control signal is set to be at a logic "high" level 'H' and the second to $L^{th}$ bits SW_CNT<2:L> of the switch control signal are all set to be at a logic "low" level 'L'. Because the node nd11_1 is connected to the test node nd13 when the NMOS transistor 173_1 is turned on 'ON', the node nd11_1 may be monitored by the monitoring signal MTS output through the test node nd13.

Figure 6:
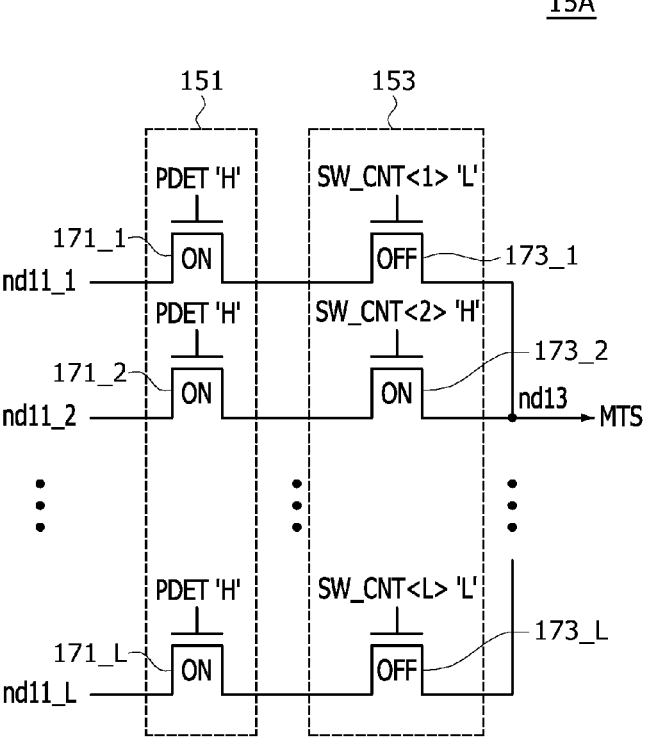

As shown in FIG. 6, when the power PW received by the electronic device 1 rises to the preset voltage level and the power detection signal PDET is activated at a logic "high" level 'H', all of the NMOS transistors 171_1 and 171_2~171_L included in the connection control circuit 151 may be turned on 'ON'. Accordingly, the internal nodes nd11_1, nd11_2~nd11_L may be connected to the switch control circuit 153. When the test for monitoring the internal nodes nd11_1, nd11_2~nd11_L is performed and the first to $L^{th}$ bits SW_CNT<1:L> of the switch control signal are set to have a second logic bit set, the NMOS transistor 173_2 included in the switch control circuit 153 may be turned on 'ON', and all of the NMOS transistors 173_1 and 173_3~173_L may be turned off 'OFF'. Here, the case where the first to $L^{th}$ bits SW_CNT<1:L> of the switch control signal are set to have the second logic bit set may mean a case in which the second bit SW_CNT<2> of the switch control signal is set to be at a logic "high" level 'H' and the first bit SW_CNT<1> of the switch control signal and the third to $L^{th}$ bits SW_CNT<3:L> of the switch control signal are all set to be at a logic "low" level 'L'. Because the node nd11_2 is connected to the test node nd13 when the NMOS transistor 173_2 is turned on 'ON', the node nd11_2 may be monitored by the monitoring signal MTS output through the test node nd13.

Figure 7:
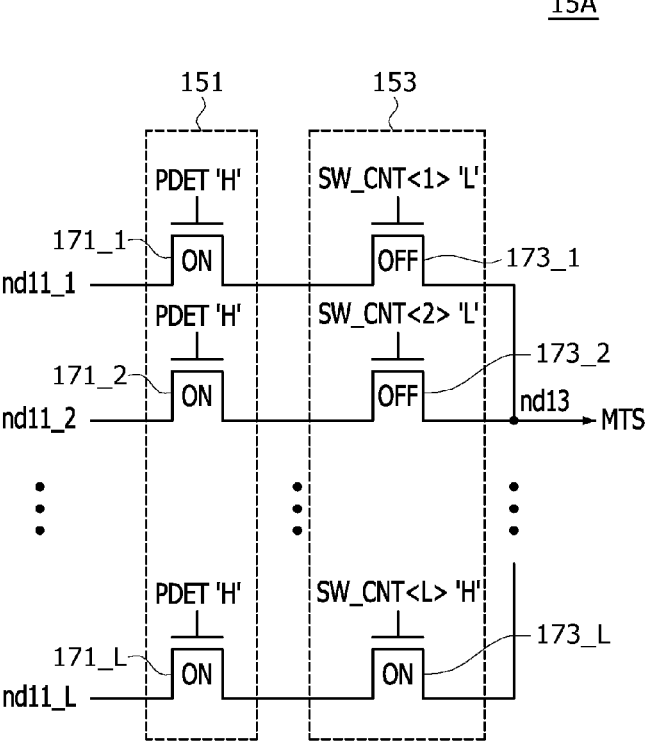

As shown in FIG. 7, when the power PW received by the electronic device 1 rises to the preset voltage level and the power detection signal PDET is activated at a logic "high" level 'H', all of the NMOS transistors 171_1 and 171_2~171_L included in the connection control circuit 151 may be turned on 'ON'. Accordingly, the internal nodes nd11_1 and nd11_2~nd11_L may be connected to the switch control circuit 153. When the test for monitoring the internal nodes nd11_1 and nd11_2~nd11_L is performed and the first to $L^{th}$ bits SW_CNT<1:L> of the switch control signal are set to have an $L^{th}$ logic bit set, the NMOS transistor 173_L included in the switch control circuit 153 may be turned on 'ON', and all of the NMOS transistors 173_1~173_(L–1) may be turned off 'OFF'. Here, the case where the first to $L^{th}$ bits SW_CNT<1:L> of the switch control signal are set to have the $L^{th}$ logic bit set may mean a case in which the $L^{th}$ bit SW_CNT<L> of the switch control signal is at a logic "high" level 'H', and the first to $(L–1)^{th}$ bits SW_CNT<1:L–1> of the switch control signal are all set to be at a logic "low" level 'L'. Because the node nd11_L is connected to the test node nd13 when the NMOS transistor 173_L is turned on 'ON', the node nd11_L may be monitored by the monitoring signal MTS output through the test node nd13.

Figure 8:
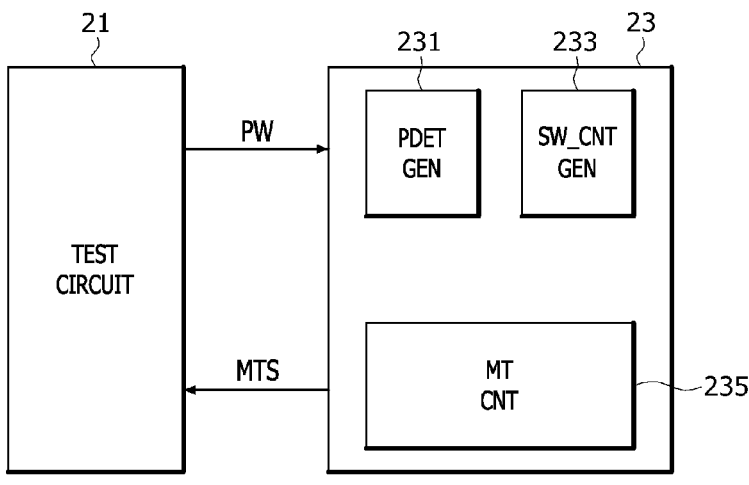
FIG. 8 is a block diagram illustrating a configuration of an electronic system according to an embodiment of the present disclosure.

FIG. 8 is a block diagram illustrating a configuration of an electronic system 2 according to an embodiment of the present disclosure. As shown in FIG. 8, the electronic system 2 may include a test circuit 21 and an electronic device 23.

The test circuit 21 may provide a power PW to the electronic device 23 for a test operation for monitoring internal nodes included in the electronic device 23. The test circuit 21 may receive a monitoring signal MTS generated by the electronic device 23 from the electronic device 23 as a result of the test operation performed after the power PW of the electronic device 23 is raised to a preset voltage level.

The electronic device 23 may receive the power PW to perform the test operation for monitoring the internal nodes, and may generate the monitoring signal MTS by the test operation to provide the monitoring signal MTS to the test circuit 21. The electronic device 23 may include a power detection signal generation circuit (PDET GEN) 231, a switch control signal generation circuit (SW_CNT GEN) 233, and a monitoring control circuit (MT CNT) 235. The power detection signal generation circuit 231, the switch control signal generation circuit 233, and the monitoring control circuit 235 may be implemented in the same way as the power detection signal generation circuit 11, the switch control signal generation circuit 13, and the monitoring control circuit 15 shown in FIG. 1, descriptions of specific configurations and operations will be omitted.

Figure 9:
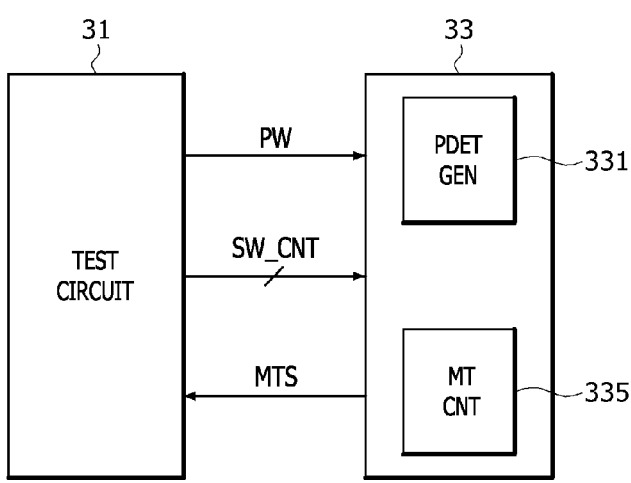
FIG. 9 is a block diagram illustrating a configuration of an electronic system according to another embodiment of the present disclosure.

FIG. 9 is a block diagram illustrating a configuration of an electronic system 3 according to another embodiment of the present disclosure. As shown in FIG. 9, the electronic system 3 may include a test circuit 31 and an electronic device 33.

The test circuit 31 may provide a power PW to the electronic device 33 for a test operation for monitoring internal nodes included in the electronic device 33. The test circuit 31 may generate a switch control signal SW_CNT and provide the generated switch control signal SW_CNT to the electronic device 33 for a test operation performed after the power PW of the electronic device 33 is raised to a preset voltage level. The test circuit 31 may receive a monitoring signal MTS generated by the electronic device 33 as a result of the test operation performed after the power PW of the electronic device 33 is raised to the preset voltage level from the electronic device 33.

The electronic device 33 may receive the power PW to perform the test operation for monitoring the internal nodes, and may generate the monitoring signal MTS by the test operation to provide the monitoring signal MTS to the test circuit 31. The electronic device 33 may include a power detection signal generation circuit (PDET GEN) 331 and a monitoring control circuit (MT CNT) 335. Because the power detection signal generation circuit 331 and the monitoring control circuit 335 may be implemented in the same way as the power detection signal generation circuit 11 and the monitoring control circuit 15 shown in FIG. 1, descriptions of specific configurations and operations are omitted.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An electronic device comprising:
a power detection signal generation circuit configured to receive power to generate a power detection signal;
a switch control signal generation circuit configured to generate a switch control signal when a test for monitoring internal nodes is performed; and
a monitoring control circuit configured to connect one of the internal nodes to a test node, based on the power detection signal and the switch control signal, and to output a monitoring signal through the test node,
wherein the monitoring control circuit includes a connection control circuit including a plurality of power switches turned on based on the power detection signal, and a switch control circuit including a plurality of selection switches turned on based on the switch control signal.

2. The electronic device of claim 1, wherein the power detection signal generation circuit generates the power detection signal that is activated when the power rises to a preset voltage level.

3. The electronic device of claim 1, wherein the switch control signal generation circuit generates the switch control signal in which a logic bit set is set to connect one of the internal nodes to the test node.

4. The electronic device of claim 1, wherein the monitoring control circuit is connected to a test pin and outputs the monitoring signal through the test pin.

5. The electronic device of claim 1, wherein each of the internal nodes is connected to a test pin through one of the power switches and one of the selection switches.

6. The electronic device of claim 1, wherein each of the power switches connected to the internal nodes is turned on when the power detection signal is activated.

7. The electronic device of claim 1,
wherein the internal nodes include a first internal node and a second internal node, and
wherein the connection control circuit includes a first power switch and a second power switch.

8. The electronic device of claim 7, wherein the first power switch connects the first internal node to the switch control circuit when the power detection signal is activated.

9. The electronic device of claim 7, wherein the second power switch connects the second internal node to the switch control circuit when the power detection signal is activated.

10. The electronic device of claim 7,
wherein the switch control signal includes a first bit of the switch control signal and a second bit of the switch control signal, and
wherein the switch control circuit includes a first selection switch and a second selection switch.

11. The electronic device of claim 10, wherein the first selection switch is turned on based on the first bit of the switch control signal in a state where the power detection signal is activated, to connect the first internal node to the test node.

12. The electronic device of claim 10, wherein the second selection switch is turned on based on the second bit of the switch control signal in a state where the power detection signal is activated, to connect the second internal node to the test node.

13. An electronic system comprising:
a test circuit configured to supply power and to receive a monitoring signal; and
an electronic device configured to receive the power to generate a power detection signal, to generate a switch control signal when a test for monitoring internal nodes is performed, to connect one of the internal nodes to a test node, based on the power detection signal and the switch control signal, and to output the monitoring signal through the test node,
wherein the electronic device includes a connection control circuit including a plurality of power switches turned on based on the power detection signal, and a switch control circuit including a plurality of selection switches turned on based on the switch control signal.

14. The electronic system of claim 10,
wherein the internal nodes include a first internal node and a second internal node, and
wherein the connection control circuit includes a first power switch and a second power switch.

15. The electronic system of claim 14, wherein the first power switch connects the first internal node to the switch control circuit when the power detection signal is activated.

16. The electronic system of claim 14, wherein the second power switch connects the second internal node to the switch control circuit when the power detection signal is activated.

17. The electronic system of claim 14,
wherein the switch control signal includes a first bit of the switch control signal and a second bit of the switch control signal, and
wherein the switch control circuit includes a first selection switch and a second selection switch.

18. An electronic system comprising:
a test circuit configured to supply power, to supply a switch control signal generated when a test for monitoring internal nodes is performed, and to receive a monitoring signal; and
an electronic device configured to receive the power to generate a power detection signal, to connect one of the internal nodes to a test node, based on the power detection signal and the switch control signal, and to output the monitoring signal through the test node, wherein the electronic device includes a connection control circuit including a plurality of power switches turned on based on the power detection signal, and a switch control circuit including a plurality of selection switches turned on based on the switch control signal.

* * * * *